United States Patent [19]

Lee et al.

[11] Patent Number: 6,096,646
[45] Date of Patent: Aug. 1, 2000

[54] METHOD FOR FORMING METAL LINE OF SEMICONDUCTOR DEVICE

[75] Inventors: Chang Jae Lee, Chungcheongbuk-do; Nae Hak Park, Seoul, both of Rep. of Korea

[73] Assignee: LG Semicon Co., Ltd., Cheongju-Si, Rep. of Korea

[21] Appl. No.: 09/049,205

[22] Filed: Mar. 27, 1998

[30] Foreign Application Priority Data

Apr. 10, 1997 [KR] Rep. of Korea ........................ 97-13205

[51] Int. Cl.⁷ .................................................. H01L 21/44
[52] U.S. Cl. .......................... 438/680; 438/622; 438/637; 438/627; 438/672
[58] Field of Search ..................................... 438/680, 687, 438/688, 622, 627, 637, 638–644, 672

[56] References Cited

U.S. PATENT DOCUMENTS

| | | | |
|---|---|---|---|
| 5,492,734 | 2/1996 | Matsumoto et al. | |
| 5,633,199 | 5/1997 | Fiordalice et al. | 438/642 |
| 5,654,232 | 8/1997 | Gardner | 438/661 |
| 5,776,829 | 7/1998 | Homma et al. | 438/641 |
| 5,849,367 | 12/1998 | Dixit et al. | 427/535 |
| 5,973,402 | 10/1999 | Shinriki et al. | 257/768 |
| 5,998,870 | 12/1999 | Lee et al. | 257/751 |

OTHER PUBLICATIONS

Takeyasu, et al, Characterization of Direct–Contact Via Plug Formed by Using Selective Aluminum Chemical Vapor Deposition, Jpn. J. Appn. Phys. vol. 33(1994) pp. 424–428, Part 1 No. 1B Jan. 1994.

Gross, M.E., et al, Liquid Source Metalorganic Chemical Vapor Deposition of Aluminum From Triethylamine Alane, J. Appl. Phys. 69 (4), Feb. 15, 1991, pp. 2589–2592.

*Primary Examiner*—Charles Bowers
*Assistant Examiner*—Thanh Nguyen

[57] ABSTRACT

A method for forming metal line of a semiconductor device in which, if the aspect ratio of the contact holes is big, contact holes are buried with a CVD method using the HDP method, and the line process is simplified to improve the reliability is disclosed, including the steps of forming an insulating film having a contact hole on a semiconductor substrate; forming a barrier metal layer on the insulating film including the contact hole; and forming a metal line layer on the barrier metal layer with a CVD method using a high density plasma.

8 Claims, 9 Drawing Sheets

METHOD FOR FORMING METAL LINE OF SEMICONDUCTOR DEVICE

BACKGROUND OF THE INVENTION

1. Field of the Invention

The present invention relates to a method for forming metal line of a semiconductor device and, more particularly, to a method for forming metal line of a semiconductor device in which, if the aspect ratio of the contact holes is big, contact holes are buried with a CVD method using the HDP method, and the line process is simplified to improve the reliability.

2. Discussion of the Related Art

In an MOS (metal oxide semiconductor) device, the electrode line technology is divided into aluminum lines for formation of gate electrodes, contacting of mutual connection of cells and source/drain impurity diffusion regions.

The characteristic of electrode line depends on 1/K reduction of power voltage and a size of a device according to scaling rule. For example, if a resistance is increased by K times with regard to a gate electrode, a delay time of signal transmission is increased. As a result, the speed of device operation is lowered.

If a resistance is increased by $K^2$ times with regard to contact holes, the density of current is increased by K times, thereby deteriorating the reliability of lines.

If a resistance is increased by K times with regard to lines, the density of current is increased by K times, thereby causing the deterioration of line reliability by electromigration.

Further, a gate electrode is made of an identical material with word lines of a memory. The material has a low resistivity.

Particularly, as design rule becomes submicronized, line resistance is increased and line pitch is reduced. Accordingly, caused is a problem of delay of RC transmission due to the increase of capacitance.

In case that the design size is less than 1 $\mu$m, due to the problem of delay of RC transmission and miniaturization of design rule, the operation speed increased by high integration is not effected and the reliability becomes poor if a gate electrode is made of polysilicon. It is because resistivity of doped polysilicon is higher than 200 $\mu\Omega$.cm. A WSix film, having a relatively good characteristic of step coverage and a resistivity of about 100 $\mu\Omega$.cm, is deposited on polysilicon to be used as an electrode in order to reduce resistance. In other words, a polycide (polysilicon+refractory silicide) is used as an electrode. However, if the line width is less than 0.5 $\mu$m according to design rule, the effect of a WSix film having a resistivity of about 100 $\mu\Omega$.cm is in vain.

In order to solve this problem, research and development is actively directed to tungsten having a resistivity of less than 10 $\mu\Omega$.cm, $TiSi_2$ having a resistivity of less than 20 $\mu\Omega$.cm, $COSi_2$. having a resistivity of less than 20 $\mu\Omega$.cm, and TiN having a resistivity of less than 30 $\mu\Omega$.cm.

As a higher integration after another has been accomplished, an aspect ratio of a contact hole is abruptly increased. Accordingly, it is required to improve the characteristic of step coverage in burying a contact hole.

In one of methods suggested for improving the step coverage characteristic, tungsten is deposited with a CVD method and etched-back to form a tungsten plug in a contact hole. Then a metal line made of, e.g., aluminum is formed on the tungsten plug. Aluminum used as line metal has such advantages as excellent adhesion with $SiO_2$, good conductivity, high degree of purity, excellent electric contact with silicon, and facility in patterning. On the other hand, aluminum has a problem of electromigration. If current density of aluminum line is heightened during circuit operation, aluminum atoms are moved. When heat is generated by current, the aluminum line is disconnected by a long-time usage. However, this problem is solved by repeatedly overlapping aluminum on plug formed in a contact hole, or by mixing 4% of copper, or by forming an aluminum line having a uniform thickness.

A background art method for forming a metal line of a semiconductor device will be described with reference to the accompanying drawings.

FIGS. 1A to 1H are cross-sectional views showing process steps of a background art method for forming a metal line of a semiconductor device.

Referring to FIG. 1A, an isolation oxide film 2 is formed on a predetermined area of a semiconductor substrate 1 so that field and active regions are defined. A gate insulating film 3 and a gate electrode 4 are formed on the semiconductor substrate 1 of the active region. Sidewall spacers 5 are formed on both sides of the gate electrode 4. Next, an ion-implanting process is performed with the gate electrode 4 and the sidewall spacers 5 serving as masks, thereby forming source/drain regions 6 having an LDD (lightly doped drain) structure beneath the surface of the semiconductor substrate 1 at both sides of the gate electrode 4. A refractory metal layer 7 is formed on the gate electrode 4 for improved performance of the gate electrode 4 (low resistance).

Referring to FIG. 1B, an oxide film 8 is formed on the entire surface of the semiconductor substrate 1 including the gate electrode 4.

Referring to FIG. 1C, a BPSG layer 9 is formed on the oxide film 8.

Referring to FIG. 1D, a photoresist film PR is coated on the BPSG layer 9 and patterned with an exposure and development proces so that the surface of the BPSG layer 9 over a placement of a contact hole is exposed.

Referring to Fig. 1E, the BPSG layer 9 and the oxide film 8 are selectively etched with the patterned photoresist film PR serving as a mask so that a predetermined area of the source/drain region 6 at one side of the gate electrode 4 is exposed, thus forming a contact hole 10.

Referring to FIG. 1F, the photoresist film PR is removed.

Referring to FIG. 1G, a barrier metal layer 11 made of Ti/TiN is formed on the surface of the BPSG layer 9 including the semiconductor substrate 1 in the contact hole 10. Subsequently, tungsten is deposited on the barrier metal layer 11 and etched-back to remain only in the contact hole 10, thereby forming a tungsten plug 12. The barrier metal layer 11 serves to improve the adhesion of the tungsten plug 12 and the semiconductor substrate 1.

Referring to FIG. 1H, an aluminum layer 13 used as a metal line is sputtered to be formed on the barrier metal layer 11.

FIGS. 2A to 2B are cross-sectional views showing process steps of another background art method for forming a metal line of a semiconductor device. In this method, an MOCVD (metalorganic chemical vapor deposition) method is applied to form a metal line. Thus, the process of forming a tungsten plug is not needed. Aluminum buries a contact hole to form a metal line in this background art method, unlike the first background art method.

Referring to FIG. 2A, an oxide film 8 and a BPSG layer 9 are formed on the entire surface of a semiconductor substrate 1 where a transistor, not shown in the drawing, is formed. Next, they are selectively patterned with a photolithography process and a photo etching process to form a contact hole 10. Thereafter, a barrier metal layer 11 consisting of Ti/TiN is formed on the entire surface of the BPSG layer 9 including the contact hole 10. Then, an aluminum layer 13 is formed on the barrier metal layer 11 with an MOCVD method. Grain and surface of the aluminum layer 13 are fluctuated.

Referring to FIG. 2B, the process of forming the aluminum layer 13 is continuously carried out with an CVD method of thermal decomposition to bury the contact hole 10. At this time, the aluminum layer 13 have many facets on its surface, which is seriously fluctuated.

A background art method for forming a metal line of a semiconductor device has the following problems.

First, since an aluminum layer is formed after forming a tungsten plug on a barrier metal layer in a contact hole, the process is complicated and the production cost is heightened and the productivity is lowered.

Second, though a line-fabricating method is used in which aluminum is buried on a barrier metal layer in a contact hole, a CVD process of thermal decomposition causes the surface of a line layer to have many facets and be fluctuated, and the metal line is unstable and the line reliability is deteriorated.

SUMMARY OF THE INVENTION

Therefore, the present invention is directed to the method for forming a metal line of a semiconductor device that substantially obviates one or more of problems due to limitations and disadvantages of the related art.

An object of the invention is to provide a method for forming a metal line of a semiconductor device in which, if an aspect ratio is high, a CVD method applying an HDP method is used to simplify the process and simply bury a contact hole, thereby forming a metal line having a good reliability.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a metal line of a semiconductor device includes the steps of forming an insulating film having a contact hole on a semiconductor substrate; forming a barrier metal layer on the insulating film including the contact hole; and forming a metal line on the barrier metal layer with a CVD method using a high density plasma.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 3A to 3H are cross-sectional views showing process steps of a method for forming a metal line of a semiconductor device according to an embodiment of the present invention.

Figure 1A:
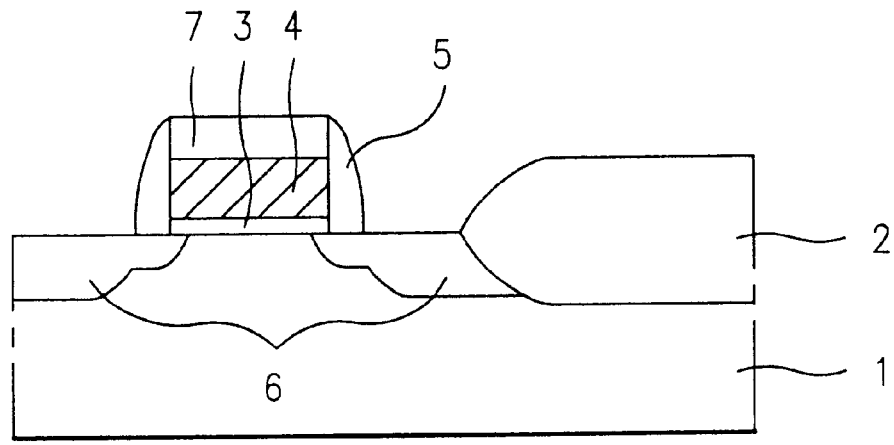
FIGS. 1A to 1H are cross-sectional views showing process steps of a background art method for forming a metal line of a semiconductor device.
Figure 1B:
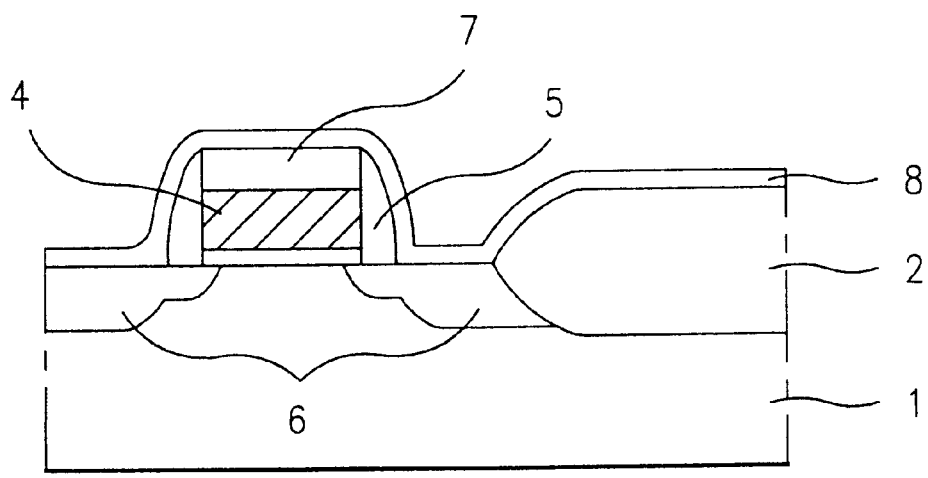
Figure 1C:
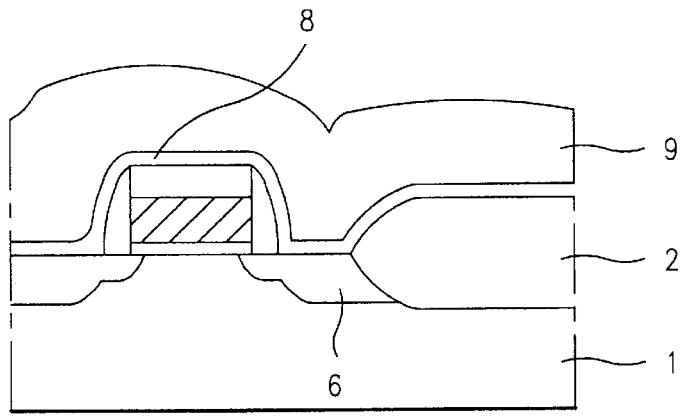
Figure 1D:
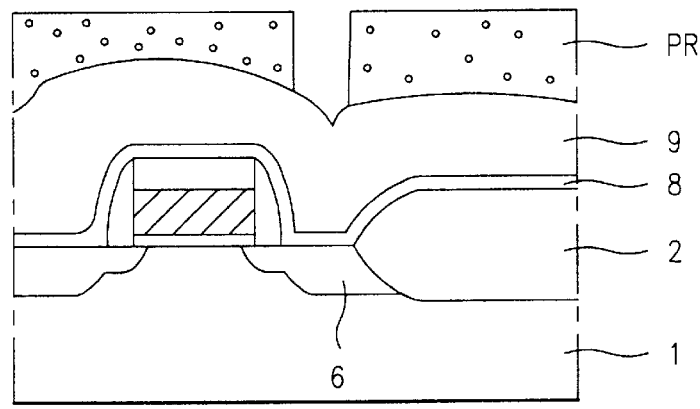
Figure 1E:
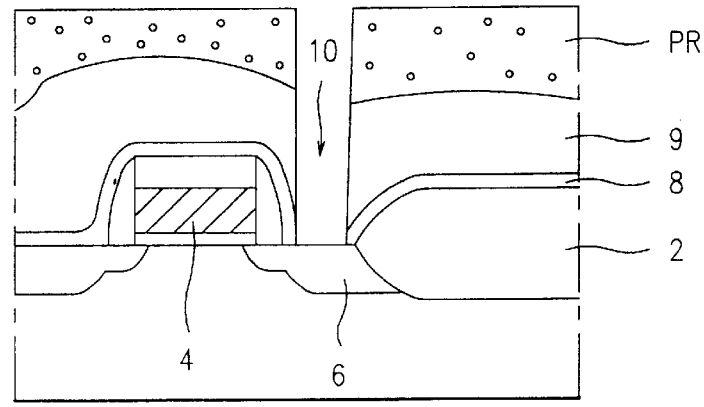
Figure 1F:
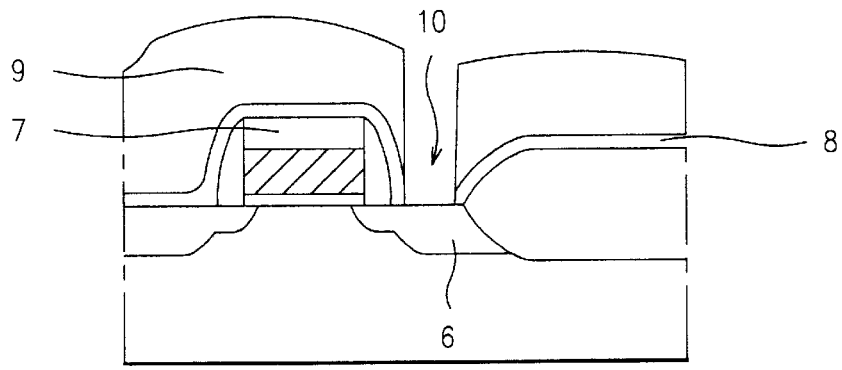
Figure 1G:
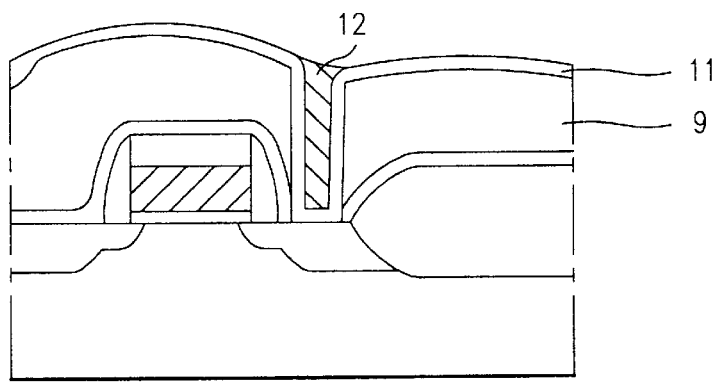
Figure 1H:
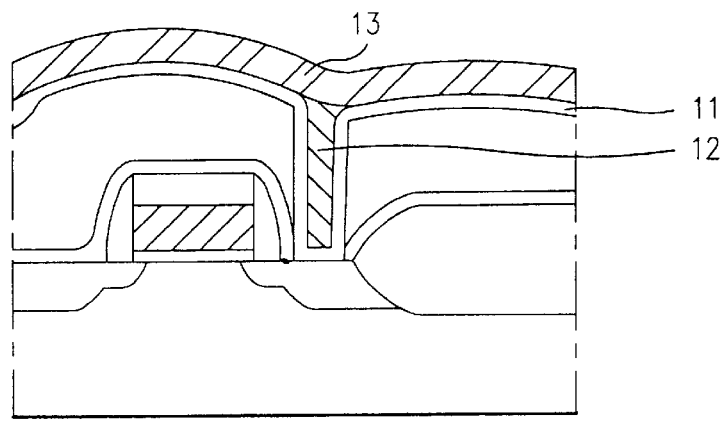
Figure 2A:
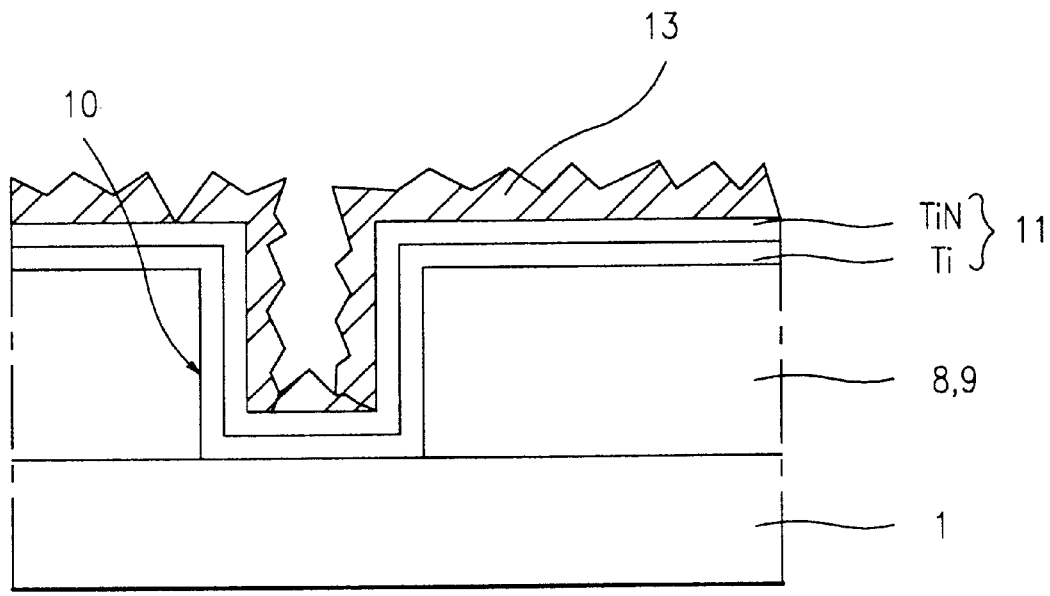
FIGS. 2A and 2B are cross-sectional views showing process steps of another background art method for forming a metal line of a semiconductor device.
Figure 2B:
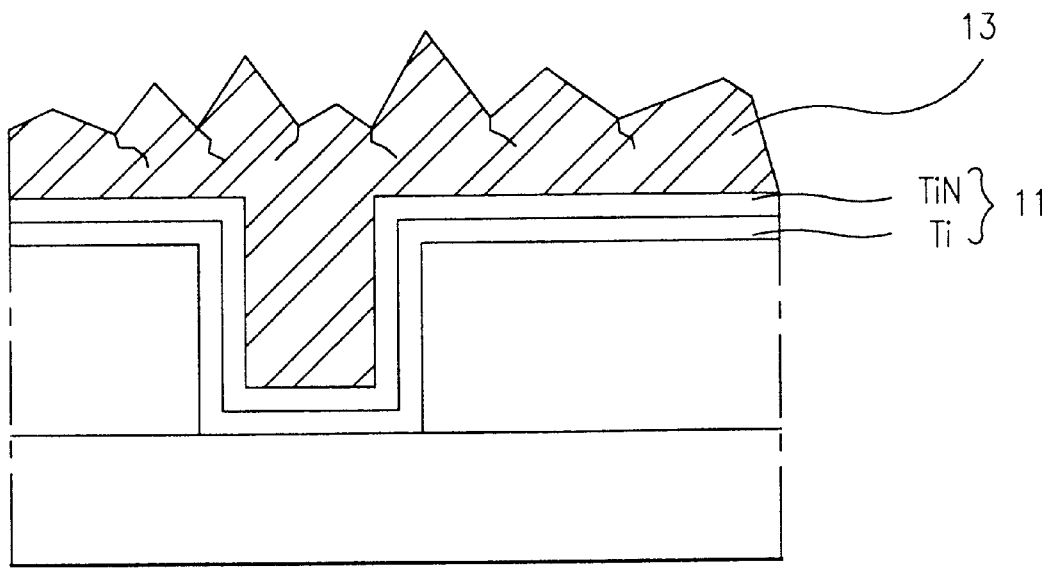
Figure 3A:
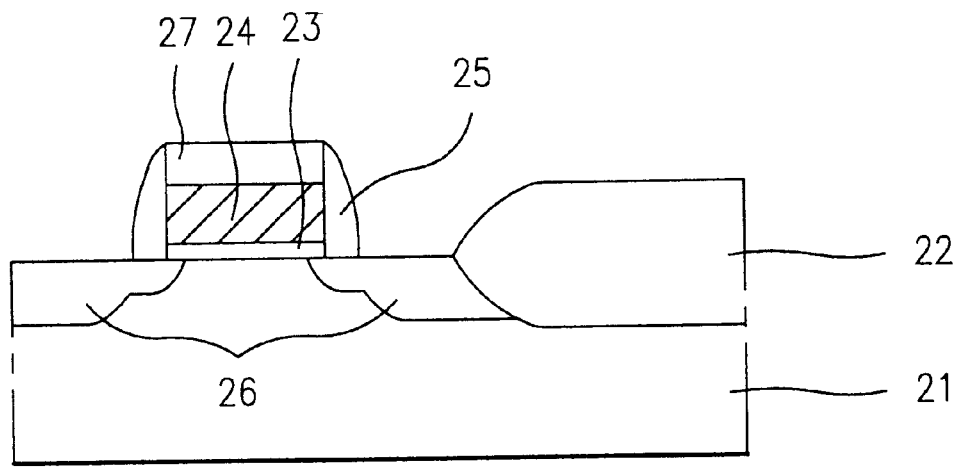
FIGS. 3A to 3H are cross-sectional views showing process steps of a method for forming a metal line of a semiconductor device according to an embodiment of the present invention.

Referring to FIG. 3A, an isolation oxide film 22 is formed on a predetermined area of a semiconductor substrate 21 so that field and active regions are defined. A gate insulating film 23 and a gate electrode 24 are formed on a predetermined area of the semiconductor substrate 21 of the active region. Sidewall spacers 25 made of an insulating material are formed on both sides of the gate electrode 24. An ion-implanting process is carried out with the gate electrode 24 and the sidewall spacers 25 serving as masks, thereby forming source/drain regions 26 having an LDD structure beneath the surface of the semiconductor substrate 21 at both sides of the gate electrode 24. A refractory metal layer 27 is formed on the gate electrode 24 for improved performance of the gate electrode 24.

Figure 3B:
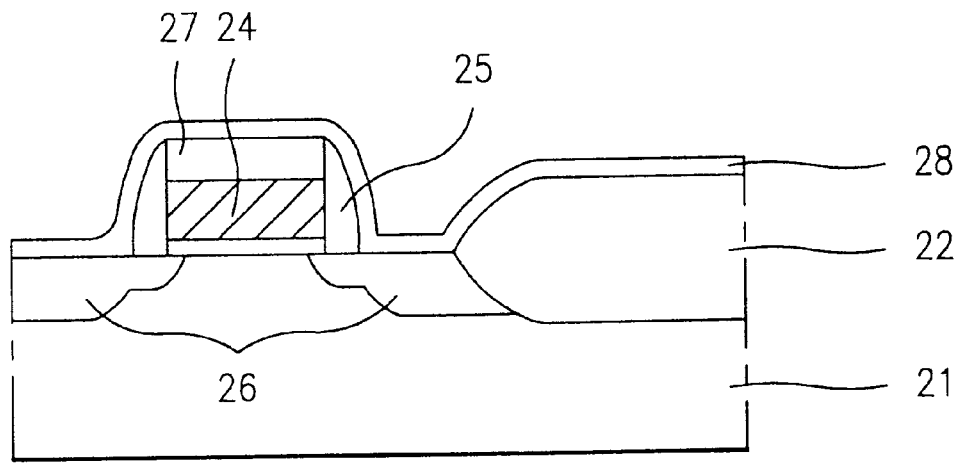

Referring to FIG. 3B, a first insulating film 28, made of either an oxide or a nitride, is formed on the entire surface of the semiconductor substrate 21 including the gate electrode 24.

Figure 3C:
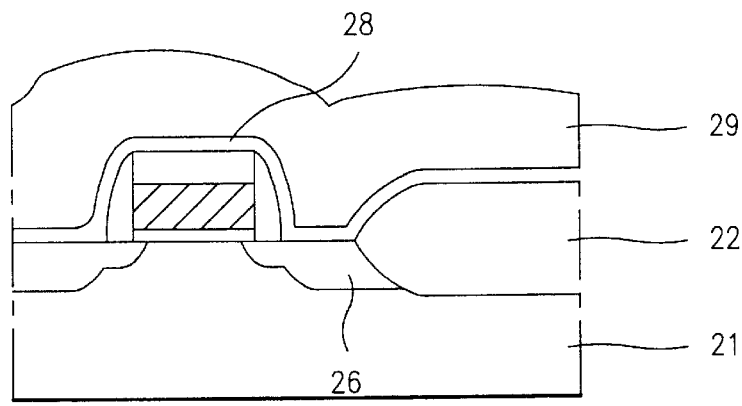

Referring to FIG. 3C, a second insulating film 29, made of a material having a good fluidity and preferably BPSG, is formed on the entire surface of the first insulating film 28.

Figure 3D:
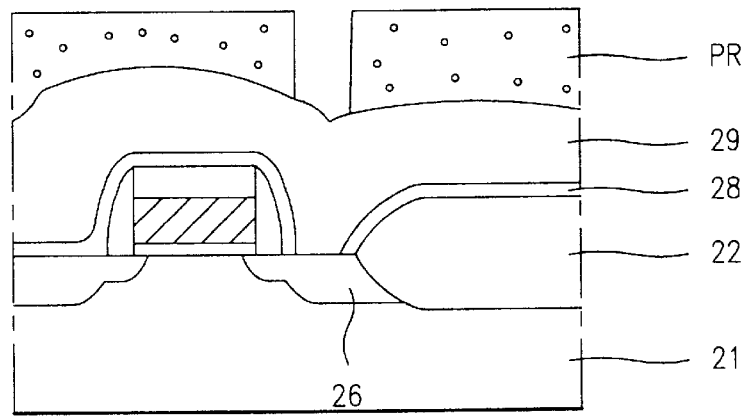

Referring to FIG. 3D, a photoresist film PR is coated on the second insulating film 29 and patterned with an exposure and development process to expose the second insulating film 29 over a placement of a contact hole.

Figure 3E:
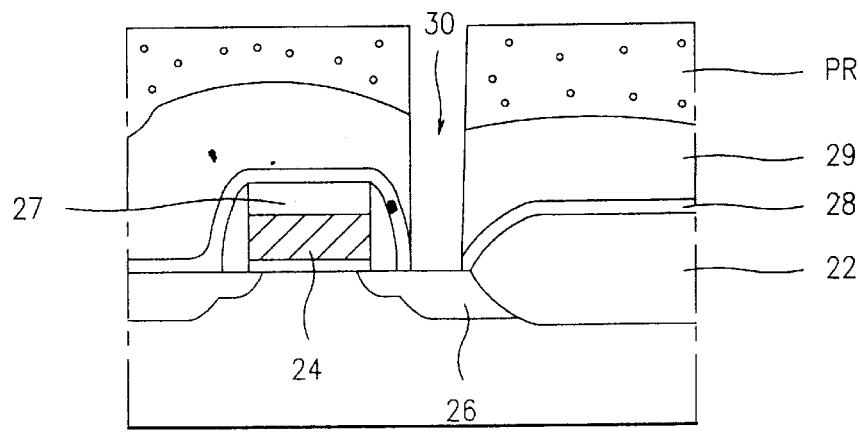

Referring to FIG. 3E, the second and first insulating films 29 and 28 are selectively removed with the patterned photoresist film PR serving as a mask to expose the substrate 21 of the source/drain region 26 at one side of the gate electrode 24, thereby forming a contact hole 30.

Figure 3F:
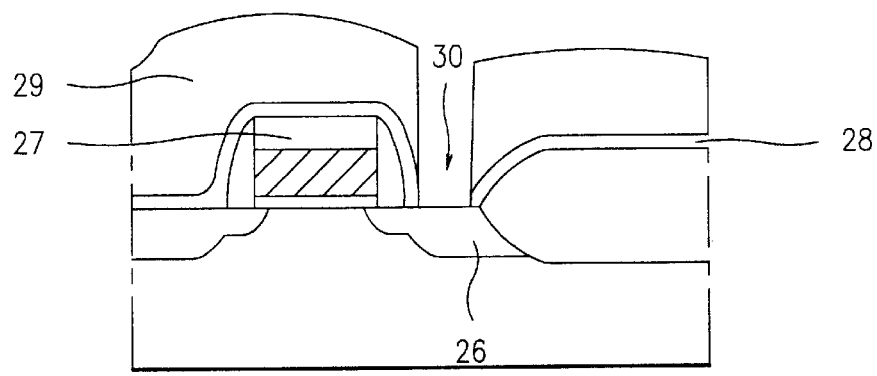

Referring to FIG. 3F, the photoresist film PR is removed.

Figure 3G:
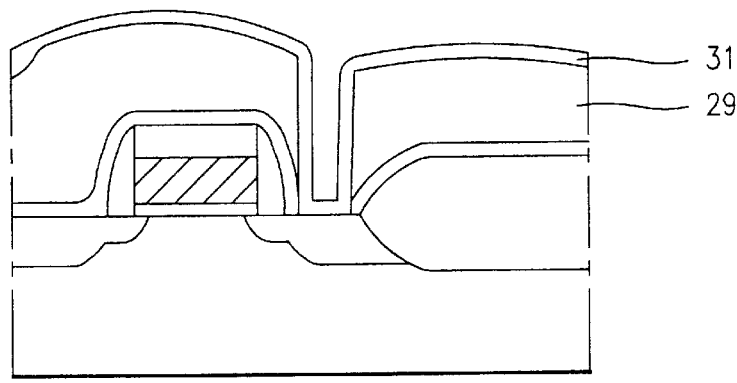

Referring to FIG. 3G, a barrier metal layer 31 made of Ti/TiN is formed on the second oxide film 29 including the substrate 21 in the contact hole 30. This barrier metal 31 serves to improve the adhesion of the substrate 21 and a metal line.

Figure 3H:
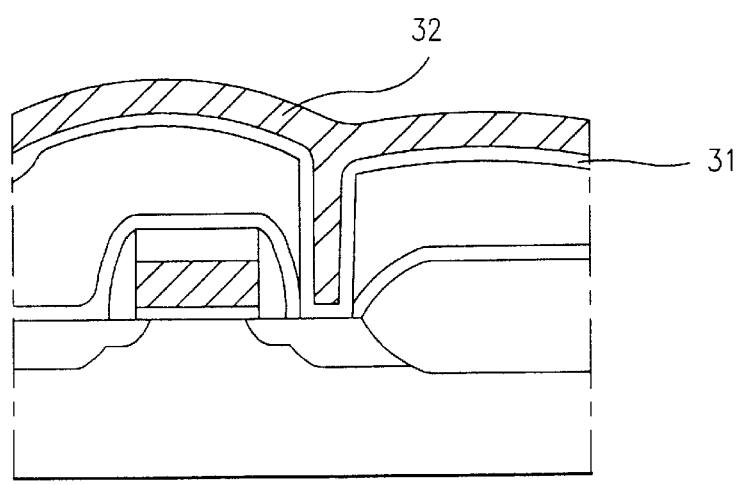

Referring to FIG. 3H, a metal line layer 32 is formed on the entire surface of the barrier metal layer 31 to completely bury the contact hole 30 with an HDP (high density plasma) CVD method. This metal line layer 32 is made of aluminum or copper.

Figure 4:
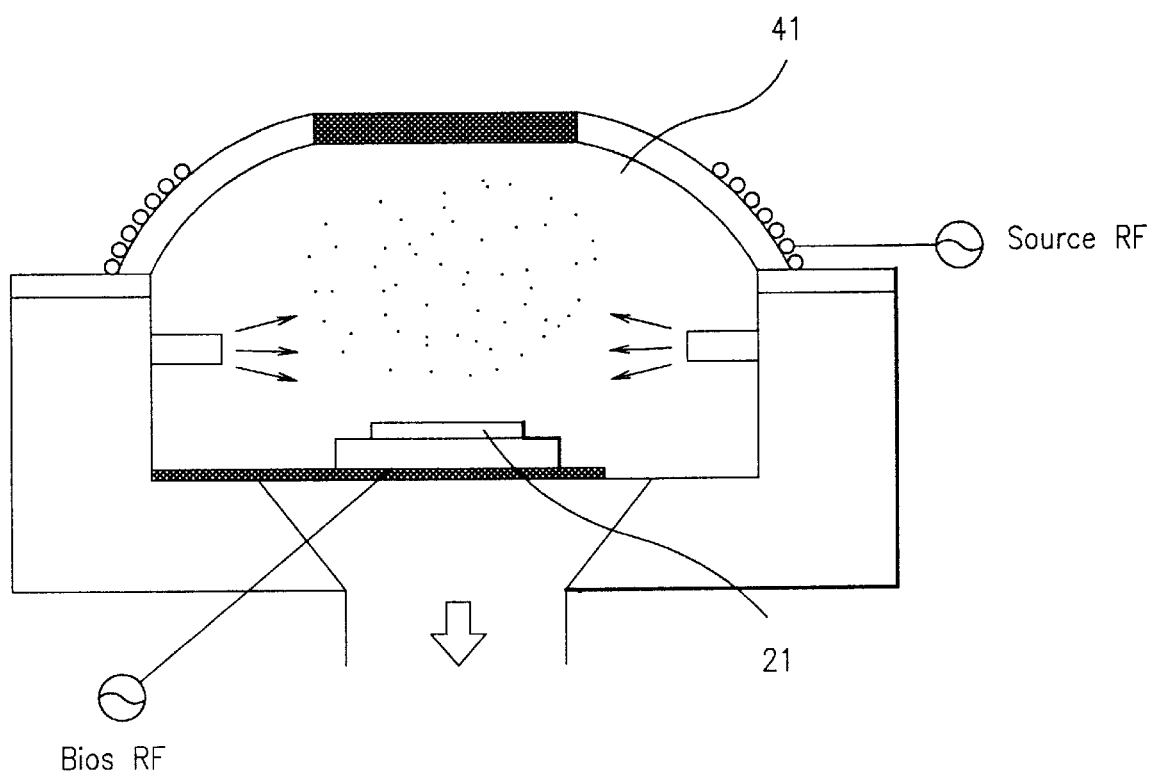
FIG. 4 shows a general high density plasma chamber.

FIG. 4 is a general HDP chamber for forming a metal line of a semiconductor device. The semiconductor substrate 21 is fixed in the HDP chamber after forming a contact hole and a barrier metal layer. Then an argon gas and a gas containing aluminum ions are injected into the HDP chamber. Aluminum source gas and argon plasma are generated to form an aluminum layer on the barrier metal layer.

At this time, the gas containing aluminum ions is a mixture gas of DMEAA (dimethyl ethyl amine alanine), DMAH (dimethyl aluminum hydride) and TIBA (triisobutyl aluminum). Helium or hydrogen gas can be used instead of argon gas.

In the HDP chamber 41, the temperature is 150~200° C., the pressure is 0.5~5 Torr, and the RF (radio frequency) power is higher than 100 W.

The process of depositing aluminum in an HDP chamber will be described with reference to FIGS. 5A to 5C, which show the details of the process shown in FIG. 3H. The part of a transistor with a gate electrode 24 is not shown, but the process performed over a placement of a contact hole 30 is described in detail.

Figure 5A:
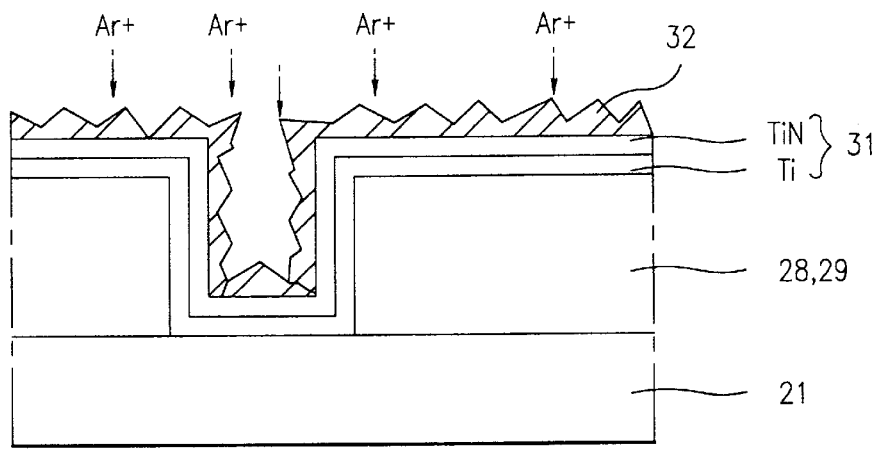
FIGS. 5A to 5C are cross-sectional views showing process steps of a method for forming a metal line a semiconductor device with a CVD process according to the present invention.

Referring to FIG. 5A, first and second insulating films 28 and 29 are selectively patterned with a photolithography process and a photo etching process to form a contact hole 30. A barrier metal layer 31 is formed on the exposed semiconductor substrate 21 and the second insulating film 29. Subsequently, the substrate 21 is fixed in an HDP chamber and argon gas and gas containing aluminum are injected at the same time for reaction, thereby generating aluminum source gas and argon plasma. Aluminum 32 from the plasma of the aluminum source gas is stacked on the barrier metal layer 31. The early aluminum layer 32 on the barrier metal layer 31 is fluctuated.

Figure 5B:
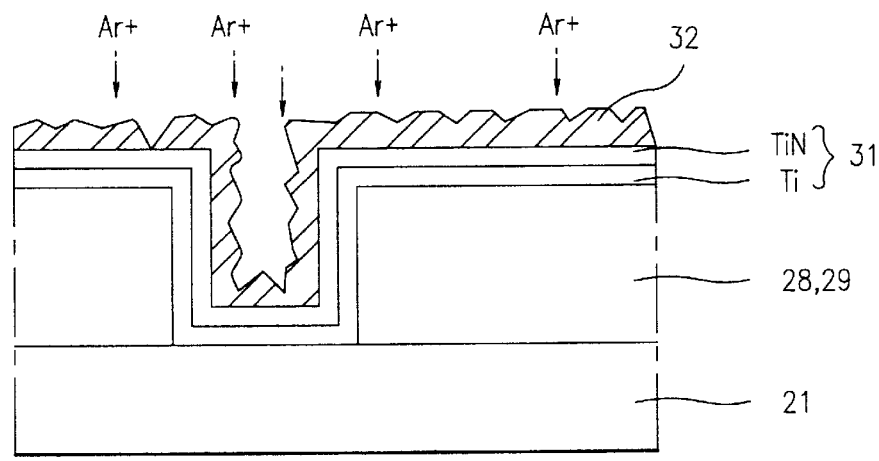

Referring subsequently to FIG. 5B, if the aluminum layer 32 is continuously deposited, argon ions with reactivity collide the aluminum layer 32 so that the aluminum layer 32 is physically detached. That is to say, the argon ions causes the sputtering etching by colliding the aluminum layer 32. At this time, the aluminum layer particles perpendicular to the argon ions are not detached but receives energy from the argon ions to be more tightly deposited. On the other hand, the aluminum layer particles parallel with the argon ions are detached and redeposited on the relatively lower surface. At this time, the more rough the surface of the aluminum layer 32 is, the more effective the process is. As this process is carried out repeatedly, aluminum layer 32 having a smooth surface is being deposited.

Figure 5C:
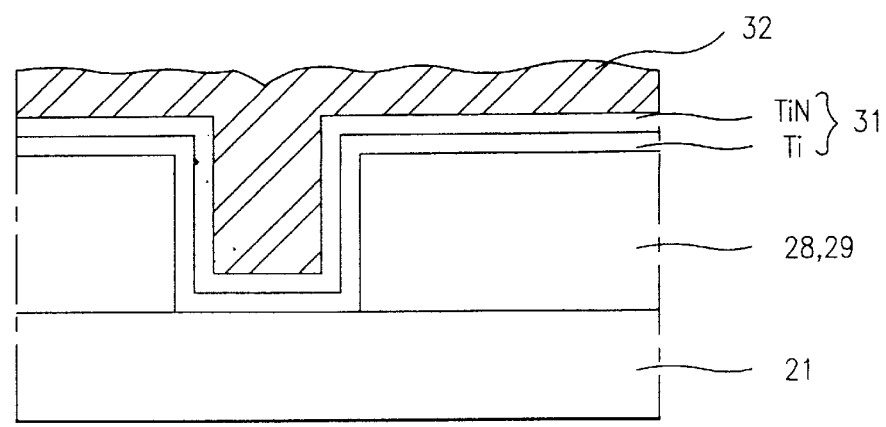

Referring to FIG. 5C, the process of forming the aluminum layer 32 is continuously performed, so that the contact hole 30 is completely buried with aluminum. This burying aluminum layer 32 is 6000~10000 Angstrom thick enough to be used as a line.

A method for forming a metal line of a semiconductor device has the following advantages.

First, the process of forming a tungsten plug on a barrier metal layer in a contact hole is omitted, and a contact hole is buried and metal line is formed at a process, thereby simplifying the process and reducing the production cost and improving the productivity.

Second, a depositing process using metal source gas and a sputtering etching process using argon ions are performed repeatedly so that a metal line having a smooth surface can be formed. Particularly, aluminum having a lower resistance than tungsten is formed in a contact hole, thereby providing a metal line of a semiconductor layer having better reliability and performance.

It will be apparent to those skilled in the art that various modification and variations can be made in the method for forming a metal line of a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for forming a metal line of a semiconductor device comprising forming an insulating film having a contact hole on a semiconductor substrate;

forming a barrier layer on the insulating film including the contact hole;

depositing a metal layer by metal ions and etching the metal layer by inert gas repeatedly via a high density plasma CVD method using metal source gas and inert gas so that the contact hole is buried and the metal layer is formed at the same time; and forming a metal line by patterning the metal layer selectively.

2. The method as claimed in claim 1, wherein the metal layer is made of aluminum or copper.

3. The method as claimed in claim 1, wherein the source gas is formed by using a mixture gas of TIBA (triisobutyl aluminum), DMAH (dimethyl aluminum hydride), and DMEAA (dimethyl ethyl amine alanine).

4. The method as claimed in claim 1, wherein the CVD method using the high density plasma is performed in a high density plasma chamber at a temperature of 150~200° C.

5. The method as claimed in claim 1, wherein the CVD method using the high density plasma is performed in a high density plasma chamber under a pressure of 0.5~5 Torr.

6. The method as claimed in claim 1, wherein the CVD method using the high density plasma is performed in a high density plasma chamber by an RF power of bigger than 100 W.

7. The method as claimed in claim 1, wherein the inert gas is any one of argon, helium, and hydrogen gas ($H_2$).

8. The method as claimed in claim 1, wherein the metal.

* * * * *